United States Patent [19]

Takano et al.

[11] Patent Number: 5,361,721

[45] Date of Patent: Nov. 8, 1994

[54] SINGLE CRYSTAL PULLING APPARATUS

[75] Inventors: Kiyotaka Takano; Izumi Fusegawa; Hirotoshi Yamagishi, all of Annaka, Japan

[73] Assignee: Shin-Etsu Handotai Co., Ltd., Tokyo, Japan

[21] Appl. No.: 12,172

[22] Filed: Feb. 2, 1993

[30] Foreign Application Priority Data

Feb. 4, 1992 [JP] Japan .................. 4-047606

[51] Int. Cl.⁵ .................. C30B 15/14; C30B 15/20
[52] U.S. Cl. .................. 117/214; 117/208; 117/217
[58] Field of Search ............... 156/617.1, 618.1, 620.4, 156/DIG. 64, DIG. 115; 422/249, 253

[56] References Cited

U.S. PATENT DOCUMENTS

| | | | |
|---|---|---|---|
| 4,330,361 | 5/1982 | Kuhn-Kuhnenfeld et al. | 422/249 |
| 4,330,362 | 5/1982 | Kulehner | 156/617.1 |
| 4,915,773 | 4/1990 | Kravetsky et al. | 156/617.1 |
| 4,956,153 | 9/1990 | Yamagishi et al. | 422/249 |
| 4,981,549 | 7/1991 | Yamashita et al. | 156/617.1 |
| 5,129,986 | 7/1992 | Seki et al. | 422/249 |
| 5,196,173 | 3/1993 | Arai et al. | 422/249 |

Primary Examiner—R. Bruce Breneman
Assistant Examiner—Felisa Garrett
Attorney, Agent, or Firm—Lowe, Price, LeBlanc & Becker

[57] ABSTRACT

A single crystal pulling apparatus of Czochralski technique type including (i) a cylindrical partition adapted to divide the surface portion of the melt into an inner part and an outer part, the former being where the single crystal is grown and the latter being where granular polycrystal material is supplied, (ii) a flat ring having heat reflecting and insulating property held horizontally above the melt, and (iii) a vertically shiftable purge tube suspended centrally into the heating chamber adapted to enter into the inner hole of the flat ring.

8 Claims, 2 Drawing Sheets

SINGLE CRYSTAL PULLING APPARATUS

BACKGROUND OF THE INVENTION

The present invention relates to a single crystal pulling apparatus for growing and pulling up a single crystal ingot from melt of a polycrystal substance based on the Czochralski (CZ) technique. In particular the invention relates to such single crystal pulling apparatus wherein granular polycrystal substance is continuously added to the melt for replenishment.

Such a single crystal pulling apparatus comprises a heating chamber wherein a single crystal is grown from molten polycrystal substance (a raw material such as silicon). In the heating chamber are provided elements such as a quartz crucible, a cylindrical heater surrounding the crucible, and a cylindrical thermal insulator (heat shield) surrounding the heater. Beneath the heating chamber are provided mechanisms for rotating the crucible together with a vertical crucible shaft, on which the crucible is fixedly mounted, to control the uniformity of the heat flux in a polycrystal molten liquid (melt) during the crystal growing operation.

The polycrystal substance charged in the quartz crucible is heated and melted down by the heater to turn into a polycrystal melt, and in this liquid is dipped a seed crystal fixed at the lower end of a pull means such as a wire, and the desired single crystal grows from the bottom tip of the seed crystal as the pull means is rotated and drawn up at predetermined rates together with the seed crystal.

In the CZ single crystal growth technology as described above, the segregation coefficients of dopants do not exceed 1 (e.g., in the case of phosphate 0.35 and in the case of boron 0.75), so that the dopant concentration of the melt soars as the single crystal growth proceeds. As a result, the resistivity distribution in the ingot tends to be such that the closer to the bottom of the ingot, the lower is the resistivity. Thus, in cases where it is required that the resistivity values throughout the cylindrical portion of the ingot must be within a certain range, the length of the cylindrical portion worth growing is limited.

Also, in the CZ single crystal growth technology, a single crystal ingot is grown in a manner such that firstly a conical portion is formed by gradually increasing the diameter of the growing crystal to a predetermined size after narrowing it in the range of 2 to 3 mm in diameter so as to prevent propagation of dislocation into the growing crystal, secondly a cylindrical portion is formed, and finally a tail portion is formed by gradually decreasing the diameter, since if the growth operation is terminated and the single crystal is removed from the melt immediately after the desired cylindrical portion is grown, the thermal stress thereby caused is of such magnitude that slip occurs in the single crystal body. Naturally the shorter the cylindrical portion, the fewer the wafers that can be obtained from the single crystal ingot.

In order to constrict the resistivity within the acceptable range so as to maximize the worth-growing length of the grown ingot and thus the number of wafers obtained from the ingot, a duplex crucible system has been adopted; according to which a cylindrical internal crucible is concentrically provided in the quartz crucible to form a duplex structure. In this system, during the growth of the single crystal, an appropriate amount of granular polycrystal substance with or without dopant is poured outside the internal crucible in a continuous manner, and thus the resistivity and concentration of interstitial oxygen become uniform along the growth axis of the ingot.

Problems the Invention seeks to solve

With the structure of the conventional single crystal pulling apparatus having the duplex crucible system, since there was no shield between the melt surface and the inner walls of the heating chamber, the heat of the melt was radiated directly to the inner walls of the heating chamber and only a portion of it was reflected back to the melt; thus, the melt surface would cool rather promptly and would start solidifying usually from the interface joining the internal crucible and the melt surface and from where the raw material was supplied, and when the entire melt surface was solidified, the quartz crucible would crack owing to the difference in density between the solidified raw material and the molten raw material, and the melt would leak cut from the crack. To solve this problem, it would be necessary to increase the heater power, or radically decrease the single crystal growth rate so as to maintain the temperature of the melt above its setting point; however, this would inevitably degrade the single crystal productivity.

As described above, as the melt loses heat to the chamber walls by radiation, the silicon monoxide (SiO) gas evaporating from the melt surface would deposit itself on relatively cool parts of the inner walls of the chamber and, when the solid SiO pieces drop in the melt in the quartz crucible, dislocations are caused in the growing crystal.

As the single crystal is grown longer, the melt amount in the crucible decreases, and as a result, the segregation accelerates and causes the dopant concentration to increase. In order to maintain the dopant concentration constant, there is a control method called melt amount reduction type control method, in which only granular silicon is supplied to the melt. In the case of adopting such control method, the area by which the melt contacts the crucible is reduced so that in proportion to this the amount of the oxygen that dissolves into the melt from the crucible is reduced and as the result the interstitial oxygen concentration of the single crystal gradually decreases with the crystal growth, making the single crystal biased.

The present invention was made in view of the above problems, and it is, therefore, an object of the invention to provide a single crystal pulling apparatus which is designed such that it can produce, at high productivity, high quality dislocation-free single crystal ingots of high yield, having uniform distribution of resistivity and interstitial oxygen concentration, and such that the life of the crucible is extended greatly to reduce the running cost.

SUMMARY OF THE INVENTION

Means to solve the Problems

In order to attain the above objects, the present invention proposes an improved single crystal pulling apparatus of Czochralski technique type for growing and pulling up a single crystal ingot from a polycrystal melt contained in a quartz crucible provided in a generally cylindrical heating chamber, in which are also provided a heater, an thermal insulator, and a conduit for continuously supplying granular polycrystal material to the crucible. In this improved single crystal pulling apparatus:

a cylindrical partition is provided which is adapted to divide the surface portion of the melt contained in the crucible into an inner part and an outer part, said inner part being where the single crystal is grown and said outer part being where granular polycrystal material is supplied;

a ring shield having heat reflecting and insulating property and having an outer diameter slightly smaller than the inner diameter of the cylindrical heating chamber is stationarily provided above said crucible; and a vertically shiftable purge tube is suspended centrally into the heating chamber from above to provide a passage for a purge gas, which tube has an outer diameter slightly smaller than the inner diameter of said ring shield and is adapted to enter into the inner hole of said ring shield.

Preferably, the cylindrical partition is made of quartz, the heat shield and the vertically shiftable purge tube are made of carbon.

In a preferred embodiment, the ring shield is a flat ring of a multilayer construction comprising an internal layer made of a heat insulating material enclosed in an external layer of carbon.

Also, the cylindrical partition can be a vertical tubular cylinder having holes at its lower part and welded to the bottom of the crucible in a manner such that the tubular cylinder becomes concentric with the crucible.

In a best mode embodiment, the cylindrical partition is a vertical cylindrical ring held by the vertically shiftable purge tube at the latter's lower end portion; or more precisely, the cylindrical ring is hooked on a holder ring of carbon connected to the lower end of the vertically shiftable purge tube and the holder ring has a plurality of gas escape holes, whose total area S satisfies the following inequality:

$$S >> \pi \times D \times h$$

wherein $\pi$ is the ratio of the circumference of a circle to its diameter, D is the inner diameter of the purge tube, and h is the predetermined distance from the surface of the melt at which the lower end of the carbon tube 10 is held during the single crystal pulling operation.

In another aspect of the invention, there is provided an improved method for growing and pulling up a single crystal ingot from a polycrystal melt in an apparatus as described above, comprising the steps of:

(a) lowering the purge tube until the lower end of the purge tube is disposed at a predetermined distance of h from the melt surface, whereby the cylindrical partition is partially dipped in the melt thereby isolating the inner part of the melt surface from the outer part thereof;

(b) sending an inert gas down in the purge tube, (c) pulling up the single crystal ingot; and (d) continuously supplying the granular polycrystal material through the conduit to the outer part of the melt surface.

Effects of the Invention

According to the invention, in a single crystal pulling apparatus, the radiation heat from the melt surface is reflected by the ring shield and returns to the quartz crucible, and also the heat is hard to be conducted beyond the ring shield by virtue of the heat insulating effect of the ring shield, so that the heat in the space of the heating chamber under the ring shield is effectively preserved; consequently, solidification of the surface of the melt is prevented, which would otherwise start from the vicinity of the cylindrical partition (inner crucible) or from where the raw material is supplied; as the result, it is possible to further the growth rate of the single crystal, and thus the ingot productivity is increased.

Also, by virtue of the heat insulating effect of the ring shield, the various parts such as the rim of the quartz crucible are prevented from cooling, so that the SiO gas evaporated from the melt surface would not solidify and deposit on the chamber wall or the quartz crucible; furthermore, since the SiO gas is smoothly purged out by means of the inert gas, such as argon, passed in the purge tube, the growing crystal will not develop dislocation and will form high quality single crystal. Also, since the flow of the inert gas (argon gas) is conveniently directed by the purge tube to the single crystal growth interface where single crystal is growing, the growth interface is most effectively cooled by the smooth gas flow; consequently, the temperature gradient as taken radially across the melt surface becomes steep, and, therefore, it is possible to increase the growth rate (pulling rate) of the single crystal 17 without lowering the temperature of the melt. Thus, the productivity of single crystal ingot is further improved.

In this invention, the duplex crucible system is realized by means of the cylindrical partition, which divides the melt surface into the internal single crystal growth region and the external raw material supply region; so that it is possible to continuously supply the granular raw material and dopant at an appropriate rate to the raw material supply region outside the cylindrical partition via the conduit. Consequently, it is now possible to maintain the resistivity within a desired range throughout the growth of the single crystal, and as the result, the worth-growing length of the single crystal ingot is increased and the yield of the single crystal ingot is improved.

Furthermore, in a preferred embodiment, since the cylindrical partition is adapted to shift vertically carried by the purge tube, this embodiment of the invention is compatible with the melt amount reduction type control method: as the amount of the melt decreases and the melt level goes down in the crucible, the cylindrical partition is controlled to lower correspondingly, and as the result, the total area of the crucible and the the cylindrical partition wetted by the melt is roughly kept constant, so that the distribution of the concentration of interstitial oxygen becomes even along the growth axis of the ingot. Furthermore, the cylindrical partition confronts the surface flow of the melt caused by the rotation of the crucible or the heat convection of the melt, thereby checking the floating powdery polycrystal from approaching the single crystal ingot, and the cylindrical partition also prevents the thermal disorder in the melt in the vicinity of the single crystal ingot; consequently, the crystal dislocation is further minimized, and the oxygen concentration distribution across any plane of the single crystal ingot cut perpendicular to the growth axis becomes uniform.

The present invention will become more fully understood from the detailed description given hereinbelow and the accompanying drawings which are given by way of illustration only, and thus are not limitative of the present invention.

Embodiments

An embodiment of the invention will be described with reference to the attached drawings.

Figure 1:
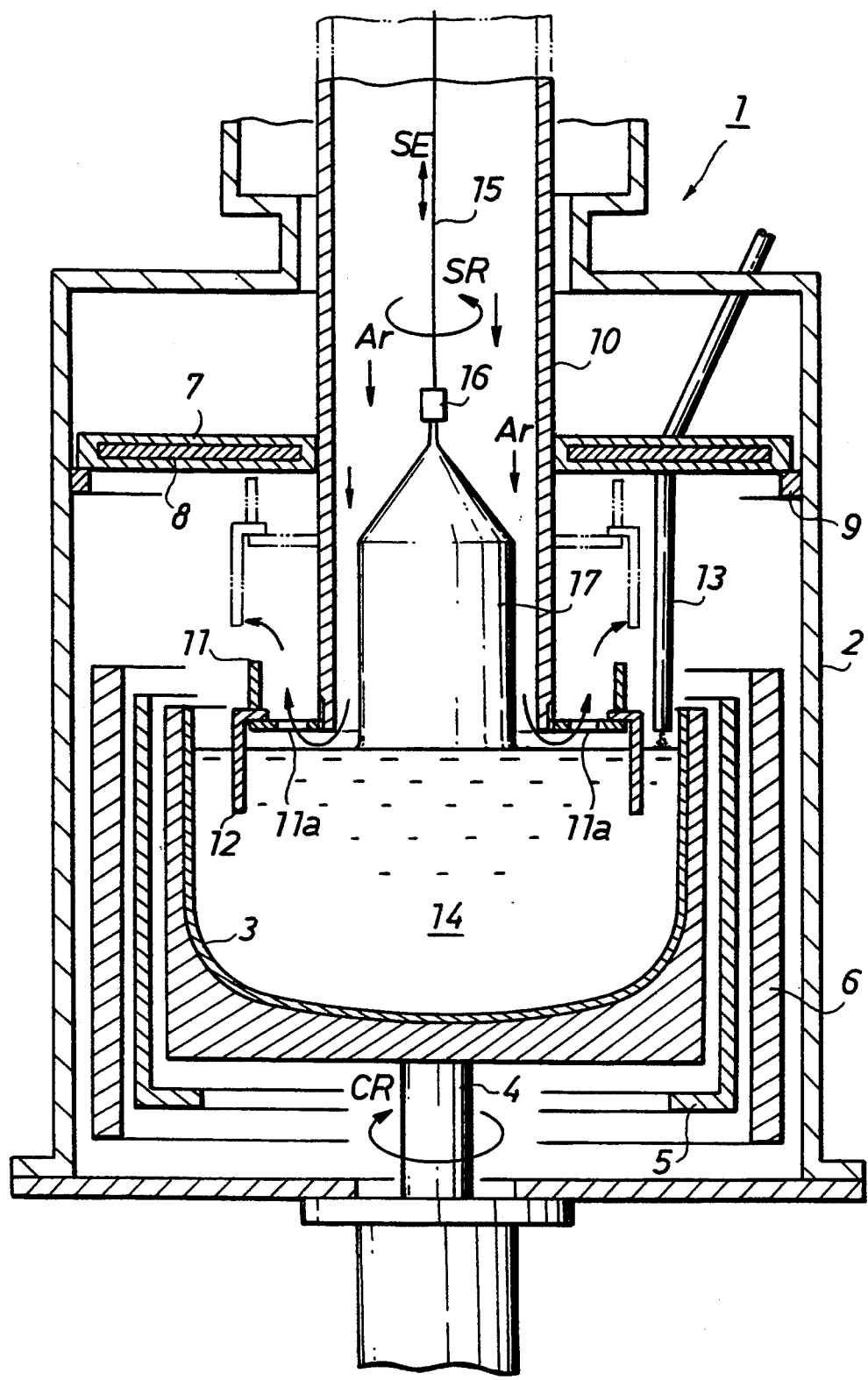
FIG. 1 is a vertical sectional drawing showing the construction of a portion of a single crystal pulling apparatus where improvement is made according to the invention.

FIG. 1 is a vertical cross-sectional drawing showing the construction of a portion of a single crystal pulling apparatus where improvement is made according to the invention, and where the reference numeral 2 designates a cylindrical heating chamber made of stainless steel. Inside the heating chamber 2 is a crucible assembly which consists of an internal quartz crucible 3 and an external graphite crucible, and is fixed on top of a vertical crucible shaft 4, which is adapted to turn about its axis and shift vertically by means of a drive mechanism, not shown.

Encompassing these crucibles inside the chamber 2 are a cylindrical heater 5 made of carbon and a cylindrical heat shield 6 also made of carbon, the latter 6 surrounding the former 5.

As shown in FIG. 1, at a location above the crucible assembly is provided a horizontal upper ring 7, which is mounted on an annular shelf 9 welded to the inner wall of the chamber 2. This upper ring 7 is made of carbon and, enclosing a heat insulating layer 8 therein, is of a multi-layer construction. The upper ring 7 is inserted into the chamber 2 through a side entrance made in the wall of the chamber 2.

From above the heating chamber 2, a carbon tube 10 is suspended into the chamber 2 to dispose concentric with the heating chamber 2 and the crucible assembly. This tube 10 made of carbon has an outer diameter slightly smaller than the inner diameter of the upper ring 7, so that the tube 10 penetrates the ring 7 and freely shifts therein vertically. Round the lower end portion of this carbon tube 10 is screwed threadably a retainer ring 11 made of carbon, and a cylindrical quartz partition ring 12 having a height of about 5 cm and concentric with the carbon tube 10 is retained by the retainer ring 11. Incidentally, the carbon tube 10 is adapted to shift vertically by means of a drive mechanism, not shown, provided above the carbon tube 10.

Now, how the upper ring 7, carbon tube 10, quartz partition ring 12, etc. are assembled in the single crystal pulling apparatus 1 will be described with reference to FIG. 1. Firstly, the upper ring 7 is horizontally inserted into the chamber 2 from the back side thereof, and is laid on the horizontal annular shelf 9 to engage with it. Secondly, the carbon tube 10 is vertically lowered from above the heating chamber 2 to penetrate the upper ring 7. Then, the retainer ring 11 is screwed on the lower end portion of the carbon tube 10 and the quartz partition ring 12 is hooked on the retainer ring 11; thus, the assembling shown in FIG. 1 is accomplished.

The retainer ring 11 consists of a vertical portion and a horizontal portion, and a plurality of gas escape holes 11a are made in the latter in a manner such that the sum S of the areas of these gas escape holes 11a satisfies the following inequality:

$$S >> \pi \times D \times h$$

wherein $\pi$ is the ratio of the circumference of a circle to its diameter, D is the inner diameter of the carbon tube 10, and h is the predetermined distance from the surface of the melt at which the lower end of carbon tube 10 is held during the pulling operation.

In the present embodiment, the carbon tube 10 and the retainer ring 11 are entirely coated with SiC.

Incidentally, in FIG. 1, the reference numeral 13 designates a quartz tube for continuously replenishing the crucible 3 with the granular raw material (or the granular raw material and a dopant) at an appropriate supply rate.

Next, the operation of the single crystal pulling apparatus 1 of the invention will be described.

In growing a single crystal ingot, such as silicon, the atmosphere in the heating chamber 2 of the pulling apparatus 1 is made non-oxidizing: the air is continuously drawn out and argon gas is kept supplied at such rates that the pressure in the chamber 2 is kept at a predetermined low level (e.g., 30 millibar); granular polycrystal silicon is charged into the quartz crucible 3 by way of the quartz tube (conduit) 13; then, the polycrystal silicon charged in the crucible 3 is heated and melted down by the heater 5 to form a molten liquid 14 (initial melting).

Incidentally, in the case where a transparent quartz glass is used to make the quartz partition ring 12, since the viscosity of the transparent quartz glass is 14.5 poise at 1075° C. (distortion point), 13.0 poise at 1180° C. (annealing point), and 7.6 poise at 1730° C. (softening point), the strength of the transparent quartz glass undergoes a gradual degradation with increasing temperature; hence, when the heating power of the heater 5 is increased as at the times of initial melting of the polycrystal silicon and re-melting of the polycrystal silicon for single-crystallization thereof, the strength of the quartz partition ring 12 itself may become so poor that it fails to remain hooked on the retainer ring 11 and falls into the melt 14, or that it undergoes devitrification and, as the result, surface spallation. Thus, in the present embodiment, it is so arranged that at the time of the initial melting of the polycrystal silicon when the heating power of the heater 5 is increased, the carbon tube 10 is receded upward over the quartz crucible 3 until the quartz partition ring 12 assumes the position drawn in two-dot chain line in FIG. 1; since the quartz partition ring 12 is sufficiently removed from the heating zone, it does not undergo deformation or degradation.

It is desirable that the quartz partition ring 12 is made of a high purity quartz glass containing few bubbles and scarce amount of hydroxyl (OH) group, for the reason that the smaller the amounts of these the greater the heat resistance of the quartz partition ring 12. Thus, such high quality quartz partition ring 12 would suffer scarce damages, as it is dipped in the silicon melt 14. With regard to the purity of the quartz glass, it is needless to say that it must be made high as that of the quartz crucible 3, so as to keep the silicon melt 14 as clean as possible.

When the initial melting of the polycrystal silicon is accomplished, the carbon tube 10 together with the quartz partition ring 12 is lowered until the lower end of the carbon tube 10 is disposed at the predetermined distance of h from the melt surface, as shown in FIG. 1, whereupon part of the quartz partition ring 12 is dipped into the surface of the melt 14 contained in the quartz crucible 3. Next, a pull wire 15 hanging vertically in the carbon tube 10 is lowered until the seed crystal 16 fixed at the lower end of the wire 15 is dipped in the melt 14 contained in the quartz crucible 3.

Next, the crucible shaft 4 and the crucible assembly supported thereon are caused to rotate about their common axis of rotation at a predetermined rate in the clockwise direction CR; simultaneously with this, the wire 15 together with the seed crystal 16 is caused to spin at a predetermined rate in the counterclockwise direction SR, and to rise at a predetermined rate SE. As a result, a single crystal ingot 17 grows from the seed crystal 16 provided at the lower end of the pull wire 15, as shown in FIG. 1.

As the single crystal pulling operation proceeds, argon gas is sent down in the carbon tube 10, and it escapes from the carbon tube 10 and enters the chamber 2 by way of the gas escape holes 11a formed in the retainer ring 11. Eventually, the argon gas is discharged from the chamber 2 carrying the SiO gas evaporated from the surface of the melt 14.

Thus, by virtue of the carbon tube 10, the argon gas sent down toward the melt surface forms a laminar flow in the carbon tube 10, and the flow rate is also improved, so that the SiO gas is effectively carried out of the chamber 2; as a result, the occurrence of dislocation in the single crystal 17 caused by SiO is minimized, and the quality of the resulting single crystal ingot 17 is improved. Also, since the argon gas flow is conveniently directed by the carbon tube 10 to the single crystal growth interface where single crystal is growing, the growth interface is most effectively cooled by the smooth argon gas flow; consequently, the temperature gradient as taken radially across the melt surface becomes steep, and, therefore, it is possible to increase the growth rate (pulling rate) SE of the single crystal 17 without lowering the temperature of the melt 16. Thus, the productivity of single crystal ingot is improved, too.

Figure 2:
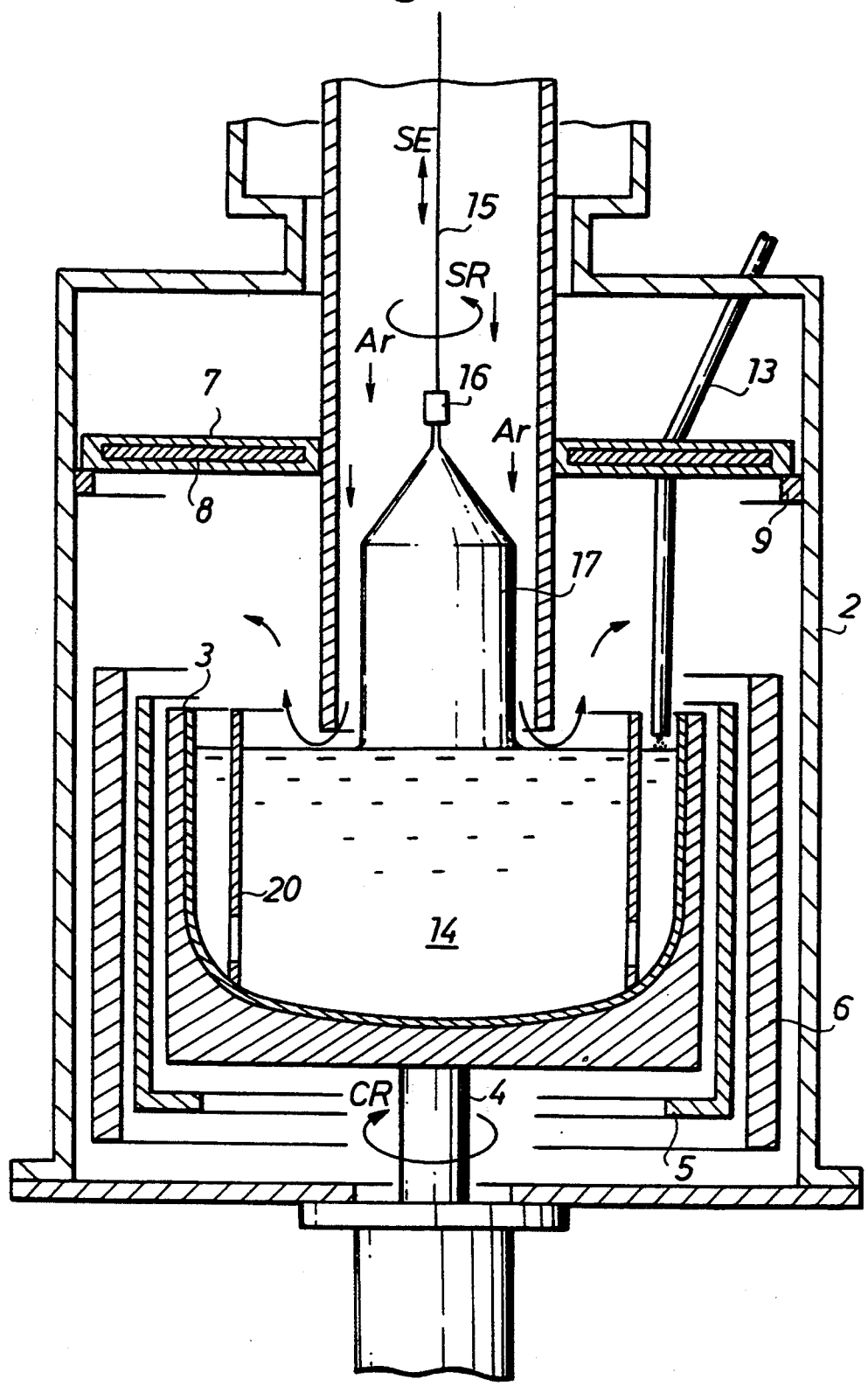
FIG. 2 is a drawing similar to FIG. 1, showing the construction of another embodiment of the invention.

Incidentally, the sum S of the areas of the gas escape holes 11a is set to a value as specified above; as the result, the escape area becomes sufficiently great so that the argon gas escapes from the carbon tube 10 as smoothly as if there were not the quartz partition ring 12 dipped in the melt 16 or the retainer ring 11, in other words, just like FIG. 2.

Furthermore, since the radiant heat radiated from the surface of the melt 14 is reflected back by the upper ring 7 and also the heat convection does not extend beyond the upper ring 7 by virtue of the heat insulating layer 8 enclosed therein, the heat underneath the upper ring 7 in the heating chamber 2 is effectively preserved; consequently, solidification of the surface of the melt 14 is prevented, which would otherwise start from the vicinity of the quartz partition ring 12 or from where the raw material is supplied (that is, between the wall of the crucible 3 and the quartz partition ring 12). As the result, it is possible to further the growth rate (pulling rate) SE of the single crystal 17, and thus the ingot productivity is increased.

Incidentally, in the present embodiment, the upper ring 7 is made of carbon with the heat insulating layer 8 enclosed therein. Since the upper ring 7 is required to have a low heat conductivity in the thickness direction and a high heat conductivity in the facial direction, it is also possible to adopt a three layer ring, for the upper ring 7, consisting of two hard carbon plates with a carbon felt layer sandwiched therebetween, in which the felt fibers are arranged such that they run in parallel with the ring faces. Or, alternatively, in order to attain an extremely low thermal conductivity in thickness direction, it is good to adopt a swollen graphite ring which is made by swelling graphite in a manner roughly similar to the manner in which popcorn is made, and then compressing it into a flat plate, and punching it into a ring shape; in such a one-layer thick ring, a numerous number of extremely thin carbon scales are laminated and at the same time numerous narrow spaces are left between these carbon scales (adiabatic void layer).

Also, due to the heat preservation under the upper ring 7 effected by the upper ring 7, such parts as the upper portion of the quartz crucible 3 and the inner wall of the chamber 2 are kept from cooling, and as a result, the SiO gas evaporated from the melt surface are prevented from depositing and sticking on the inner wall of the chamber 2 and the quartz crucible 3; in addition to this, since the argon gas that flows down in the carbon tube 10 smoothly purges the SiO gas, no solid SiO drops in the melt; hence, no dislocation would occur in the single crystal 17.

Incidentally, while the single crystal 17 is being grown and pulled up, the carbon tube 10 and the retainer ring 11 are always subjected to the ultra-high temperature of 1400° C. or higher, but since they are entirely coated with SiC, as described above, their thermal resistivity at ultra-high temperatures is reinforced so that they do not undergo degradation to give off carbon spalls, which would drop and disturb the smooth growth of the single crystal 17. If on the contrary the carbon tube 10 and the retainer ring 11 were not coated with SiC, the carbon tube 10 and the retainer ring 11 would easily undergo degradation at such ultra-high temperatures, and their degraded surfaces would peel off and fall into the melt 14 to thwart the sound growth of the single crystal 17. In such cases, since carbon is insoluble in the silicon melt 14, no sooner does the fallen carbon contact the growth interface than polycrystallization starts; or, the resulting single crystal 17 would contain carbon at an extremely high concentration and would yield a reduced number of good wafers.

Also, since the quartz partition ring 12 is required to divide only the surface portion of the melt 14, it suffices that the partition ring 12 is partially dipped in the melt 14; thus, the height of the quartz partition ring 12 can be small (about 5 cm in this embodiment), and being of such a small size, the quartz partition ring 12 experiences only a slight thermal deformation, so that the physical strength is maintained. Consequently, the selection for its material as well as dimension can be relatively flexible; thus, the material cost as well as machining cost can be low.

In this embodiment of the invention, the duplex crucible system is realized by means of the quartz partition ring 12, which divides the melt surface into the internal single crystal growth region and the external raw material supply region; so that it is possible to continuously supply the granular raw material and dopant at an appropriate rate to the raw material supply region outside the quartz partition ring 12 via the quartz tube 13. Consequently, it is now possible to maintain the resistivity within a desired range throughout the growth of the single crystal 17, and as the result, the worth-growing length of the single crystal ingot is increased and the yield of the single crystal ingot is improved.

Furthermore, since the quartz partition ring 12 is adapted to shift vertically carried by the carbon tube 10, this embodiment of the invention is compatible with the melt amount reduction type control method: as the amount of melt 14 decreases and the melt level goes down in the quartz crucible 3, the quartz partition ring 12 is lowered correspondingly, and as the result, the total area of the quartz crucible 3 and the the quartz partition ring 12 wetted by the melt 14 is roughly kept constant so that the distribution of the concentration of interstitial oxygen becomes even along the growth axis of the ingot. Furthermore, as in the case of conventional duplex crucible system, the quartz partition ring 12 confronts the surface flow of the melt caused by the rotation of the quartz crucible 3 or the heat convection of the melt, thereby checking the floating powdery polycrystal from approaching the single crystal ingot 17, and the partition ring 12 also prevents the thermal disorder in the melt 14 in the vicinity of the single crystal ingot 17; consequently, the crystal dislocation is further minimized, and the oxygen concentration distribution across any plane of the single crystal ingot 17 cut perpendicular to the growth axis becomes uniform.

Incidentally, in the pulling operation of a single crystal 17, it is essential to conduct a diameter control of the ingot being grown so as to secure a high yield of the product ingot, and also, it is necessary to be always prepared to promptly cope with any abnormality that can take place inside the heating chamber 2. For these reasons, it ought to be possible for the operator to visually observe, from outside the chamber 2, the vicinity of the liquid-solid growth interface in the quartz crucible 3 as well as the heater 5, the quartz crucible 3, etc. However, when a tube such as the carbon tube 10 of the present embodiment is suspended from above the heating chamber 2, the field of view from outside the chamber 2 becomes so narrow that it would be impossible to directly inspect the solid-liquid growth interface position by means of an image sensor. Thus, in the present embodiment, holes are made through the upper ring 7 and the carbon tube 10, not shown, so that it is possible to directly see the solid-liquid growth interface position in the heating chamber 2 through these holes.

Now, in the above embodiment of the invention, the quartz partition ring 12 is hooked at the lower end portion of the carbon tube 10, and this quartz partition ring 12 is partially dipped in the surface portion of the melt 14 to thereby realize the duplex crucible system; however, the present invention is also applicable to a single crystal pulling apparatus of a construction as shown in FIG. 2, wherein the duplex crucible system is realized by welding a cylindrical quartz partition (internal crucible) 20 to the bottom of the crucible (external crucible) 3 in a manner such that the quartz partition 20 becomes concentric with the crucible 3. In order to provide passage for the newly supplied polycrystal material to reach the inner part where crystal is grown, the quartz partition is formed with holes at its lower part.

Results of the Invention

As is clear from the above description, according to the invention, in a single crystal pulling apparatus of Czochralski technique type for growing and pulling up a single crystal ingot from a polycrystal melt contained in a quartz crucible, to which granular polycrystal material is continuously supplied: a cylindrical partition is provided to divide the surface portion of the melt into an inner part and an outer part; a flat ring having heat reflecting and insulating property is provided above the crucible; and a vertically shiftable purge tube is adapted to enter into the inner hole of said flat ring; so that it is now possible to obtain a high quality single crystal ingot at high productivity which has even distribution of resistivity and that of the concentration of interstitial oxygen along the growth axis, and which has high yield of wafers.

Obviously many modifications and variations of the present invention are possible in the light of the above teachings. It is therefore to be understood that within the scope of the appended claims the invention may be practiced otherwise than is specifically described.

For example, the ring shield may consist of a plurality of rings assembled in a manner similar to those of a water bath.

What is claimed is:

1. A Czochralski single crystal pulling apparatus which comprises:

a generally cylindrical heating chamber containing a crucible, a heater, a thermal insulator, and a conduit for continuously supplying granular polycrystal material to said crucible;

a cylindrical partition which is adapted to divide a surface portion of a polycrystal melt contained in said crucible into an inner portion and an outer portion, said inner portion being where the single crystal is grown and said outer portion being where granular polycrystal material is supplied to the polycrystal melt;

a ring shield having a heat reflecting and insulating property, a central hole and an outer diameter slightly smaller than an inner diameter of said cylindrical heating chamber, said ring shield being stationarily provided above said crucible; and a vertically shiftable purge tube which is suspended centrally into said heating chamber from above, said purge tube providing a passage for a purge gas and having an outer diameter which is slightly smaller than an inner diameter of said ring shield, said purge tube being adapted to enter into the central hole of said ring shield.

2. The apparatus as claimed in claim 1 wherein said cylindrical partition is made of quartz, said ring shield is a flat ring made of carbon, and said vertically shiftable purge tube is made of carbon.

3. The apparatus as claimed in claim 1 wherein said ring shield is of a multilayer construction comprising an internal layer made of a heat insulating material enclosed in an external layer of carbon.

4. The apparatus as claimed in claim 2 wherein said cylindrical partition is a vertical tubular cylinder having holes at a lower portion thereof and is welded to the bottom of the crucible so as to be concentric with said crucible.

5. The apparatus as claimed in claim 2 wherein said cylindrical partition is a vertical cylinder ring which is held by said vertically shiftable purge tube at a lower end portion thereof.

6. The apparatus as claimed in claim 5 wherein said cylindrical ring is hooked on a holder ring of carbon connected to the lower end of said vertically shiftable purge tube and said holder ring has a plurality of gas escape holes, whose total area S satisfies the following inequality:

$$S >> \pi \times D \times h$$

wherein $\pi$ is the ratio of the circumference of a circle to its diameter, D is the inner diameter of the purge tube, and h is the predetermined distance from the surface of the melt at which the lower end of the carbon tube 10 is held during the single crystal pulling operation.

7. The single crystal pulling apparatus as claimed in claim 1, wherein all surfaces of said purge tube and said cylindrical ring are coated with SiC.

8. The single crystal pulling apparatus as claimed in claim 1, wherein through-holes are provided in said ring shield and said purge tube in a manner such that it is possible to directly see a solid-liquid interface position in the heating chamber through said through-holes.

* * * * *